(12) United States Patent
Lim et al.

(10) Patent No.: US 11,011,724 B2
(45) Date of Patent: May 18, 2021

(54) DISPLAY APPARATUS

(71) Applicant: LG Display Co., Ltd., Seoul (KR)

(72) Inventors: Hyeongjun Lim, Paju-si (KR); Hansun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/453,150

(22) Filed: Jun. 26, 2019

(65) Prior Publication Data

US 2020/0006694 A1 Jan. 2, 2020

(30) Foreign Application Priority Data

Jun. 28, 2018 (KR) .......................... 10-2018-0074481

(51) Int. Cl.
*H01L 51/52* (2006.01)
*H01L 27/32* (2006.01)
*H01L 51/50* (2006.01)

(52) U.S. Cl.
CPC ........ *H01L 51/5203* (2013.01); *H01L 27/322* (2013.01); *H01L 27/3211* (2013.01); *H01L 51/5056* (2013.01); *H01L 51/5072* (2013.01)

(58) Field of Classification Search
CPC ............. H01L 51/5003; H01L 51/5056; H01L 51/5072; H01L 27/3211; H01L 27/322
USPC ......................................................... 257/40
See application file for complete search history.

(56) References Cited

U.S. PATENT DOCUMENTS

| | | | | |
|---|---|---|---|---|
| 2006/0214566 A1* | 9/2006 | Moriyama | .......... | H01L 27/3244 313/504 |
| 2011/0284881 A1* | 11/2011 | Shikina | ................ | G09G 3/3233 257/88 |
| 2012/0299883 A1* | 11/2012 | Sumida | ............... | H01L 27/3211 345/204 |
| 2013/0134450 A1* | 5/2013 | Chang | ................. | H01L 51/5265 257/88 |
| 2015/0179978 A1* | 6/2015 | Sato | ..................... | H01L 51/5209 257/40 |
| 2016/0013249 A1* | 1/2016 | Wang | .................. | H01L 27/3211 257/40 |
| 2016/0172423 A1* | 6/2016 | Nendai | ............... | H01L 51/0005 257/40 |
| 2016/0254493 A1* | 9/2016 | Sun | ..................... | H01L 51/5218 257/40 |
| 2019/0237523 A1* | 8/2019 | Zhai | ..................... | H01L 27/3246 |

FOREIGN PATENT DOCUMENTS

JP 2012123129 A 6/2012
WO 2011/145174 A1 11/2011

OTHER PUBLICATIONS

Office Action dated May 1, 2020, issued in corresponding Japanese Patent Application No. 2019-120018.

* cited by examiner

*Primary Examiner* — Igwe U Anya
(74) *Attorney, Agent, or Firm* — Morgan, Lewis & Bockius LLP

(57) ABSTRACT

Disclosed is a display apparatus. The display apparatus includes a substrate including a first subpixel, a second subpixel, and a third subpixel. A bottom electrode is on the substrate. A light emitting layer is on the bottom electrode, and a top electrode is on the light emitting layer. Each of the first subpixel, the second subpixel, and the third subpixel includes a first mode pixel having a first viewing angle and a second mode pixel having a second viewing angle that is less than the first viewing angle.

26 Claims, 11 Drawing Sheets

DISPLAY APPARATUS

CROSS-REFERENCE TO RELATED APPLICATIONS

This application claims the benefit of the Korean Patent Application No. 10-2018-0074481 filed on Jun. 28, 2018, which is hereby incorporated by reference as if fully set forth herein.

BACKGROUND

Technical Field

The present disclosure relates to a display apparatus for displaying an image.

Discussion of the Related Art

With the advancement of information-oriented society, requirements for display apparatuses for displaying an image are increasing. Therefore, various display apparatuses, such as liquid crystal display (LCD) apparatuses, plasma display panels (PDPs), and organic light emitting display apparatuses, have been recently used.

Organic light emitting display apparatuses are self-emitting display apparatuses and typically do not need a separate backlight. Therefore, in comparison with LCD apparatuses, the organic light emitting display apparatuses may be implemented to be lightweight and thin, and to have low power consumption. Also, the organic light emitting display apparatuses are typically driven with a direct current (DC) low voltage, have a fast response time, and are low in manufacturing cost.

There is a problem where information is leaked to an unauthorized person due to image information displayed by a display apparatus being visible to such a person. In order to solve the problem, a security film for providing image information to only a specific person located in front of a display apparatus is being developed.

A user may attach the security film on a display apparatus in order for an unauthorized person not to view image information displayed by the display apparatus. Also, the user may detach the security film from the display apparatus, and thus, allow the unauthorized person to view the image information displayed by the display apparatus. However, the user may need to separately keep and manage the security film.

SUMMARY

Accordingly, the present disclosure is directed to a display apparatus that substantially obviates one or more problems due to limitations and disadvantages of the related art.

An object of the present disclosure is to provide a display apparatus for selectively switching between a security mode and a normal mode.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display apparatus includes a substrate including a first subpixel, a second subpixel, and a third subpixel; a bottom electrode on the substrate; a light emitting layer on the bottom electrode; and a top electrode on the light emitting layer, wherein each of the first subpixel, the second subpixel, and the third subpixel includes a first mode pixel having a first viewing angle and a second mode pixel having a second viewing angle that is less than the first viewing angle.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION OF THE DISCLOSURE

Figure 1:
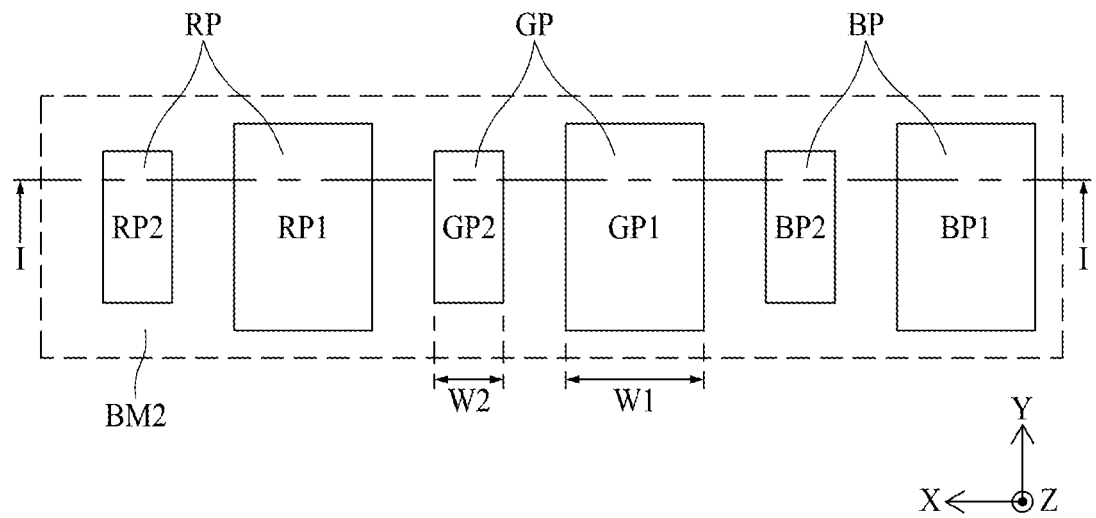
FIG. 1 is a plan view schematically illustrating subpixels of a display apparatus according to an embodiment of the present disclosure.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise," "have," and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when a position relation between two parts is described as "on~," "over~," "under~," and "next~," one or more other parts may be disposed between the two parts unless "just" or "direct" is used.

In describing a time relationship, for example, when the temporal order is described as "after~," "subsequent~," "next~," and "before~," a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can understand. The embodiments of the present disclosure may be carried out independently from each other, or may be carried out together in co-dependent relationship.

Hereinafter, example embodiments of the present disclosure will be described in detail with reference to the accompanying drawings.

Figure 2:
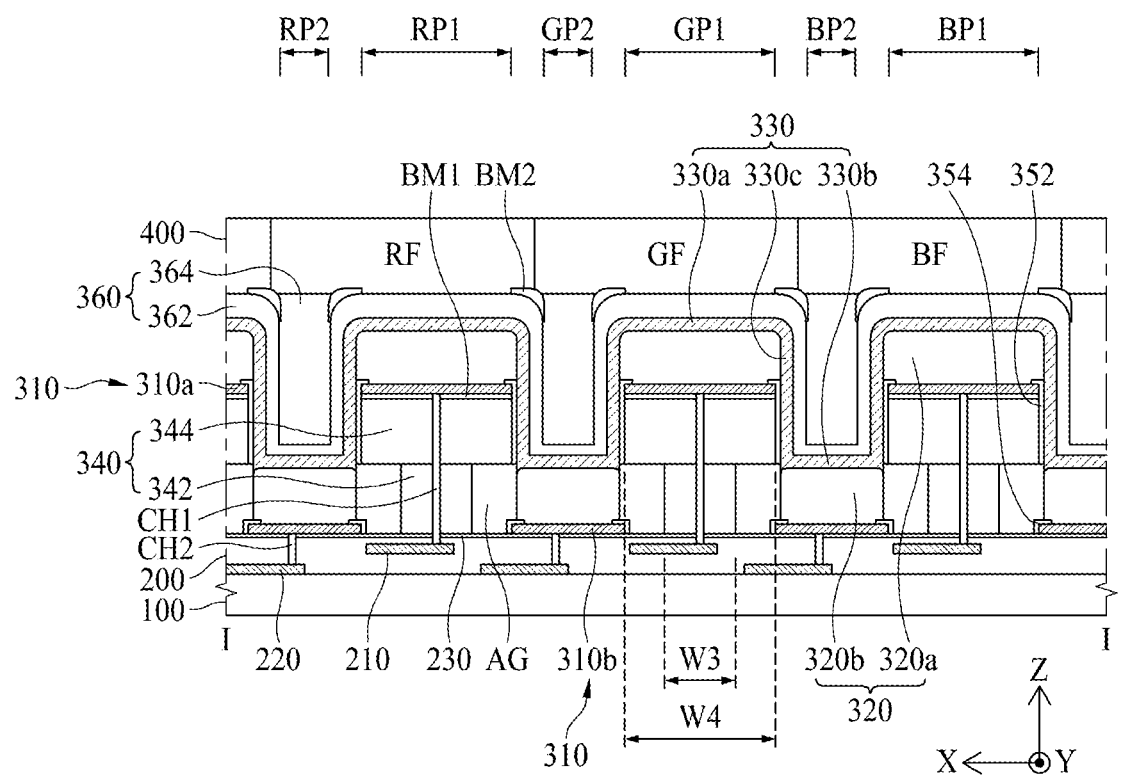
FIG. 2 is a cross-sectional view illustrating a first example taken along line I-I of FIG. 1.

FIG. 1 is a plan view schematically illustrating subpixels of a display apparatus according to an embodiment of the present disclosure, and FIG. 2 is a cross-sectional view illustrating a first example taken along line I-I of FIG. 1.

With reference to FIGS. 1 and 2, the display apparatus according to an embodiment of the present disclosure may include a substrate 100, a circuit device layer 200, a bottom electrode 310, a light emitting layer 320, a top electrode 330, a low refractive structure 340, a first insulation layer 352, a second insulation layer 354, an encapsulation layer 360, a first black matrix BM1, a second black matrix BM2, and a color filter 400.

The substrate 100 may be a plastic film, a glass substrate, or a silicon wafer substrate which is formed through a semiconductor process. The substrate 100 may be formed of a transparent material or an opaque material.

The display apparatus according to an embodiment of the present disclosure may be implemented as a top emission type where emitted light is discharged to an upper portion. Accordingly, a material of the substrate 100 may use an opaque material as well as a transparent material.

A first subpixel RP, a second subpixel GP, and a third subpixel BP may be provided in the substrate 100. The first subpixel RP may emit red (R) light, the second subpixel GP may emit green (G) light, and the third subpixel BP may emit blue (B) light. However, the present disclosure is not limited thereto. In other embodiments, a fourth subpixel which emits white light may be further provided in the substrate 100. Also, an arrangement order of the subpixels RP, GP, and BP may be variously modified.

Hereinafter, for convenience of description, an example where the first subpixel RP emits red light, the second subpixel GP emits green light, and the third subpixel BP emits blue light will be described.

The first to third subpixels RP, GP, and BP may respectively include a plurality of first mode pixels RP1, GP1, and BP1 having a first viewing angle, and may respectively include a plurality of second mode pixels RP2, GP2, and BP2 having a second viewing angle which is less than the first viewing angle. The first mode pixels RP1, GP1, and BP1 may be driven in a normal mode to display an image having the first viewing angle. The second mode pixels RP2, GP2, and BP2 may be driven in a security mode to display an image having the second viewing angle which is less than the first viewing angle.

The second mode pixels RP2, GP2, and BP2 may have a viewing angle which is less than that of each of the first mode pixels RP1, GP1, and BP1. Each of the second mode pixels RP2, GP2, and BP2 may be provided so that a width W2 thereof in a first direction (an X-axis direction) is less than a width W1 of each of the first mode pixels RP1, GP1, and BP1.

The circuit device layer 200 may be provided on the substrate 100. The circuit device layer 200 may include a plurality of gate lines, a plurality of data lines, and a plurality of transistors 210 and 220. The gate lines and the data lines may be arranged to intersect one another. The gate lines may be connected to a gate driver and may be supplied with gate signals. The data lines may be connected to a data driver and may be supplied with data voltages.

A plurality of transistors may be provided in each of the subpixels RP, GP, and BP in the circuit device layer 200. Also, the transistors provided in each of the subpixels RP, GP, and BP may include a first transistor 210 for driving the first mode pixels RP1, GP1, and BP1, and a second transistor 220 for driving the second mode pixels RP2, GP2, and BP2.

Two transistors 210 and 220 may be provided in one first subpixel RP according to an embodiment. In detail, a first transistor 210 for driving the first mode pixel RP1 and a second transistor 220 for driving the second mode pixel RP2 may be provided in the first subpixel RP. In this example, the first transistor 210 may be connected to the first bottom electrode 310a through a first contact hole CH1 and may apply a driving voltage for emitting red light. The second transistor 220 may be connected to the second bottom electrode 310b through a second contact hole CH2 and may apply a driving voltage for emitting red light.

Two transistors 210 and 220 may be provided in one second subpixel GP according to an embodiment. In detail, a first transistor 210 for driving the first mode pixel GP1 and a second transistor 220 for driving the second mode pixel GP2 may be provided in the second subpixel GP. In this example, the first transistor 210 may be connected to a first bottom electrode 310a through a first contact hole CH1 and may apply a driving voltage for emitting green light. The second transistor 220 may be connected to a second bottom electrode 310b through a second contact hole CH2 and may apply a driving voltage for emitting green light.

Two transistors 210 and 220 may be provided in one third subpixel BP according to an embodiment. In detail, a first transistor 210 for driving the first mode pixel BP1 and a second transistor 220 for driving the second mode pixel BP2 may be provided in the third subpixel BP. In this example, the first transistor 210 may be connected to a first bottom electrode 310a through a first contact hole CH1 and may apply a driving voltage for emitting blue light. The second transistor 220 may be connected to a second bottom electrode 310b through a second contact hole CH2 and may apply a driving voltage for emitting blue light.

The first transistor 210 and the second transistor 220 may be disposed on different layers. As illustrated in FIG. 2, a distance between the second transistor 220 and the substrate 100 may be less than a distance between the first transistor 210 and the substrate 100, but is not limited thereto. For example, the second transistor 220 may be formed on the substrate 100, and then, the first transistor 210 may be formed.

As another example, the distance between the second transistor 220 and the substrate 100 may be greater than the distance between the first transistor 210 and the substrate 100, but is not limited thereto. For example, the first transistor 210 may be formed on the substrate 100, and then, the second transistor 220 may be formed.

As another example, the first transistor 210 and the second transistor 220 may be disposed on the same layer.

In order to implement an ultrahigh resolution, a size of each of the subpixels RP, GP, and BP may decrease, and an interval between the subpixels RP, GP, and BP may decrease. In this example, in the display apparatus according to an embodiment of the present disclosure, the leakage of a current may occur between the first transistor 210 and the second transistor 220. In the display apparatus according to an embodiment of the present disclosure, the first transistor 210 and the second transistor 220 may be disposed on different layers, thereby preventing the leakage of a current from occurring between the first transistor 210 and the second transistor 220.

An anti-etch layer 230 covering an upper surface of the circuit device layer 200 may be further provided in the circuit device layer 200. The anti-etch layer 230 may prevent the gate lines, the data lines, and the transistors 210 and 220 from being damaged by an etchant in a process which is performed after the circuit device layer 200 is formed.

The low refractive structure 340 may be provided on the circuit device layer 200. The low refractive structure 340 may be provided in the first mode pixels RP1, GP1, and BP1 and may not be provided in the second mode pixels RP2, GP2, and BP2.

The low refractive structure 340 may include a first low refractive structure 342 having a first width W3 and a second low refractive structure 344 having a second width W4 which is greater than the first width W3. The first low refractive structure 342 may be provided on the circuit device layer 200 to have the first width W3. The second low refractive structure 344 may be provided on the first low refractive structure 342 to have the second width W4. Because the second width W4 of the second low refractive structure 344 may be greater than the first width W3 of the first low refractive structure 342, the low refractive structure 340 may have an undercut structure.

The first low refractive structure 342 and the second low refractive structure 344 may each be formed of an insulating material having a refractive index (for example, a refractive index of less than 1.7) which is less than that of the light emitting layer 320. Each of the first low refractive structure 342 and the second low refractive structure 344 may include an inorganic layer (for example, one of silicon oxide (SiOx) or silicon oxynitride (SiON)), but is not limited thereto.

The bottom electrode 310 may be provided on the circuit device layer 200 and the low refractive structure 340. The bottom electrode 310 may be provided in each of the subpixels RP, GP, and BP and may function as an anode of the display apparatus. The bottom electrode 310 according to an embodiment of the present disclosure may be deposited on the plurality of subpixels RP, GP, and BP without using a separate mask. In this example, the bottom electrode 310 may be self-aligned by the low refractive structure 340 and may be provided in each of the subpixels RP, GP, and BP.

Moreover, the bottom electrode 310 provided in each of the subpixels RP, GP, and BP may include a first bottom electrode 310a provided in the first mode pixels RP1, GP1, and BP1 and a second bottom electrode 310b provided in the second mode pixels RP2, GP2, and BP2.

The first bottom electrode 310a and the second bottom electrode 310b may be provided on different layers and may be respectively connected to the first transistor 210 and the second transistor 220.

In more detail, the first bottom electrode 310a may be included in the second low refractive structure 344 provided in the first mode pixels RP1, GP1, and BP1 and may be connected to the first transistor 210 through a first contact hole CH1 passing through the first low refractive structure 342 and the second low refractive structure 344.

The second bottom electrode 310b may be included in the second mode pixels RP2, GP2, and BP2 where the low refractive structure 340 is not provided and may be connected to the second transistor 220. In this example, the second bottom electrode 310b may be disposed apart from the first low refractive structure 342 provided in the first mode pixels RP1, GP1, and BP1.

The display apparatus according to an embodiment of the present disclosure may be provided as the top emission type. Therefore, each of the first bottom electrode 310a and the second bottom electrode 310b may include a stacked structure of a transparent conductive material and a reflective material, and for example, may include a metal material, which is high in reflectance, such as a stacked structure (Ti/Al/Ti) of aluminum (Al) and titanium (Ti), a stacked structure (ITO/Al/ITO) of Al and indium tin oxide (ITO), an APC alloy, or a stacked structure (ITO/APC/ITO) of an APC alloy and ITO. The APC alloy may be an alloy of Ag, palladium (Pd), and copper (Cu).

The first bottom electrode 310a and the second bottom electrode 310b may be simultaneously formed. In the display apparatus according to an embodiment of the present disclosure, the low refractive structure 340 may be provided in the first mode pixels RP1, GP1, and BP1. In this example, the first low refractive structure 342 disposed in a lower portion may be provided to have a width which is less than that of the second low refractive structure 344 disposed in an upper portion, and thus, the low refractive structure 340 may have the undercut structure. When a material included in the bottom electrode 310 is deposited on the substrate 100 where the low refractive structure 340 is provided, the first bottom electrode 310a may be provided on the low refractive structure 340, and the second bottom electrode 310b may be provided on the circuit device layer 200 where the low refractive structure 340 is not provided. In this example, the first bottom electrode 310a and the second bottom electrode 310b are provided apart from each other, and thus, the first bottom electrode 310a may not be electrically connected to the second bottom electrode 310b.

In the display apparatus according to an embodiment of the present disclosure, the first bottom electrode 310a and the second bottom electrode 310b may be simultaneously formed through self-alignment by using the low refractive structure 340 having the undercut structure without a separate pattern process. Accordingly, in the display apparatus according to an embodiment of the present disclosure, a manufacturing process may be simplified, and the manufacturing cost may be reduced.

The first insulation layer 352 may be provided to cover both ends of the first bottom electrode 310a and to expose a portion of the first bottom electrode 310a. The first insulation layer 352 may prevent emission efficiency from being reduced because a current concentrates on both ends of the first bottom electrode 310a.

Moreover, the first insulation layer 352 may be provided on a sidewall of the second low refractive structure 344 as well as both ends of the first bottom electrode 310a. When light emitted from the second light emitting layer 320b is incident on the sidewall of the second low refractive structure 344, the first insulation layer 352 may reflect the incident light to transfer reflected light to the color filter 400.

The first insulation layer 352 may be formed of an insulating material having a refractive index (for example, a refractive index of less than 1.7) which is less than that of the light emitting layer 320. The first insulation layer 352 may include an inorganic layer (for example, SiOx, SiON, or a multilayer thereof), but is not limited thereto.

The second insulation layer 354 may be provided to cover both ends of the second bottom electrode 310b and to expose a portion of the second bottom electrode 310b. The second insulation layer 354 may prevent emission efficiency from being reduced because a current concentrates on the both ends of the second bottom electrode 310b. The second insulation layer 354 may include an inorganic layer (for example, SiOx, SiON, or a multilayer thereof), but is not limited thereto. The first insulation layer 352 and the second insulation layer 354 may be simultaneously formed.

The first black matrix BM1 may be provided between the first bottom electrode 310a and the low refractive structure 340. When light emitted from the second light emitting layer 320b is incident on the first bottom electrode 310a, the first black matrix BM1 may absorb the incident light to prevent the incident light from being transferred in the first direction (the X-axis direction). The first black matrix BM1 may be formed of an organic layer including a black pigment, but is not limited thereto.

The light emitting layer 320 may be provided on the bottom electrode 310. The light emitting layer may include a hole transporting layer, a light emitting layer, and an electron transporting layer. In this example, when a voltage is applied to the bottom electrode 310 and the top electrode 330, a hole and an electron move to the light emitting layer through the hole transporting layer, and the electron transporting layer and are combined with each other in the light emitting layer to emit light.

The light emitting layer 320 may be any one of, but not limited to, a red light emitting layer for emitting red light, a green light emitting layer for emitting green light, a blue light emitting layer for emitting blue light, a yellow light emitting layer for emitting yellow light, a cyan light emitting layer for emitting cyan light, a magenta light emitting layer for emitting magenta light, and an orange light emitting for emitting orange light. In this example, the light emitting layer 320 may be provided in each of the subpixels RP, GP, and BP, and the color filter 400 may not be provided.

The light emitting layer 320 may be a white light emitting layer which emits white light. In this example, the light emitting layer 320 may be a common layer which is provided in the subpixels RP, GP, and BP in common.

When the light emitting layer 320 is a white light emitting layer, the light emitting layer 320 may be provided in a tandem structure of two or more stacks. Each of the stacks may include a hole transporting layer, at least one light emitting layer, and an electron transporting layer.

Moreover, a charge generating layer may be provided between adjacent stacks. The charge generating layer may include an n-type charge generating layer, disposed adjacent to a lower stack, and a p-type charge generating layer, which is provided on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer doped with alkali metal such as lithium (Li), sodium (Na), potassium (K), or cesium (Cs) or alkali earth metal such as magnesium (Mg), strontium (Sr), barium (Ba), or radium (Ra). The p-type charge generating layer may be formed by doping a dopant on an organic material having an ability to transport holes.

The light emitting layer 320 may include a first light emitting layer 320a disposed in the first mode pixels RP1, GP1, and BP1, and a second light emitting layer 320b disposed in the second mode pixels RP2, GP2, and BP2.

The first light emitting layer 320a and the second light emitting layer 320b may be provided on different layers and may each emit light, based on a driving mode.

In more detail, the first light emitting layer 320a may be provided on the first bottom electrode 310a provided in the first mode pixels RP1, GP1, and BP1. When the driving mode is the normal mode, the first light emitting layer 320a may emit light by applying a voltage to the first bottom electrode 310a and the first top electrode 330a.

The second light emitting layer 320b may be provided on the second bottom electrode 310b provided in the second mode pixels RP2, GP2, and BP2. When the driving mode is the security mode, the second light emitting layer 320b may emit light by applying a voltage to the second bottom electrode 310b and the second top electrode 330b.

The first light emitting layer 320a and the second light emitting layer 320b may be simultaneously formed. In the display apparatus according to an embodiment of the present disclosure, the low refractive structure 340 may be provided in the first mode pixels RP1, GP1, and BP1. In this example, the first low refractive structure 342 disposed in a lower portion may be provided to have a width which is less than that of the second low refractive structure 344 disposed in an upper portion, and thus, the low refractive structure 340 may have the undercut structure. When a material included in the light emitting layer 320 is deposited on the substrate 100 where the low refractive structure 340 is provided, the first light emitting layer 320a may be provided on the first bottom electrode 310a disposed on the low refractive structure 340, and the second light emitting layer 320b may be provided on the second bottom electrode 310b disposed on the circuit device layer 200 where the low refractive structure 340 is not provided. In this example, the first light emitting layer 320a and the second light emitting layer 320b may be provided apart from each other.

The light emitting layer 320, a common layer, may be a white light emitting layer that emits white light. When the light emitting layer 320 is the white light emitting layer, the light emitting layer 320 may be provided in a tandem structure of two or more stacks. In the white light emitting layer, there is a possibility that a leakage current occurs because an electric charge moves between adjacent subpixels due to the charge generating layer (CGL) provided between a first stack and a second stack.

In the display apparatus according to an embodiment of the present disclosure, even when the light emitting 320 is provided as the white light emitting layer, an electric charge may not move between the first light emitting layer 320a and the second light emitting layer 320b, because such an electric charge cannot move between the first light emitting layer 320a and the second light emitting layer 320b. Thus, in the display apparatus according to an embodiment of the present disclosure, a leakage current may not occur between the first light emitting layer 320a and the second light emitting layer 320b.

Moreover, in the display apparatus according to an embodiment of the present disclosure, the first light emitting layer 320a of one subpixel may be disposed apart from the second light emitting layer 320b of another subpixel, and thus, an electric charge may not move between the subpixels RP, GP, and BP. Accordingly, in the display apparatus according to an embodiment of the present disclosure, a leakage current may not occur between the subpixels RP, GP, and BP.

Therefore, the display apparatus according to an embodiment of the present disclosure may be driven without interference between driving modes. In an example where the first light emitting layer 320a is not separated from the second light emitting layer 320b, when the display apparatus is driven in the normal mode, lights may be emitted from the first mode pixels RP1, GP1, and BP1 and edge regions of the second mode pixels RP2, GP2, and BP2 adjacent to the first mode pixels RP1, GP1, and BP1. Also, when the display apparatus is driven in the security mode, lights may be emitted from the second mode pixels RP2, GP2, and BP2 and edge regions of the first mode pixels RP1, GP1, and BP1 adjacent to the second mode pixels RP2, GP2, and BP2. Thus, in the display apparatus according to an embodiment of the present disclosure, the first light emitting layer 320a and the second light emitting layer 320b may be provided apart from each other, and may thereby be driven without interference between the driving modes.

In the display apparatus according to an embodiment of the present disclosure, the first light emitting layer 320a and the second light emitting layer 320b may be simultaneously formed through self-alignment by using the low refractive structure 340 having the undercut structure without a separate pattern process. Accordingly, in the display apparatus according to an embodiment of the present disclosure, a manufacturing process may be simplified, and the manufacturing cost may be reduced.

The top electrode 330 may be provided on the light emitting layer 320. The top electrode 330 may be a common layer which is provided in the subpixels RP, GP, and BP in common and may function as a cathode of the display apparatus.

Moreover, the top electrode 330 may include a first top electrode 330a disposed in the first mode pixels RP1, GP1, and BP1, a second top electrode 330b disposed in the second mode pixels RP2, GP2, and BP2, and a third top electrode 330c connecting the first top electrode 330a to the top electrode 330b. For example, the top electrode 330 may be provided in the first mode pixels RP1, GP1, and BP1, the second mode pixels RP2, GP2, and BP2, and a boundary region therebetween.

The display apparatus according to an embodiment of the present disclosure may be implemented as a top emission type. Therefore, each of the first to third top electrodes 330a to 330c may include a semitransparent conductive material. Each of the first to third top electrodes 330a to 330c may be formed of a transparent conductive material (or TCO), such as indium tin oxide (ITO) or indium zinc oxide (IZO), or a semi-transmissive conductive material, such as magnesium (Mg), silver (Ag), or an alloy of Mg and Ag.

The encapsulation layer 360 may be provided on the top electrode 330. The encapsulation layer 360 may be provided to cover the top electrode 330 and may prevent oxygen or water from penetrating into the light emitting layer 320 and the top electrode 330. To this end, the encapsulation layer 360 may include at least one inorganic layer and at least one organic layer. In detail, the encapsulation layer 360 may include a first inorganic layer 362 and an organic layer 364.

The first inorganic layer 362 may be provided to cover the first to third top electrodes 330a to 330c. The first inorganic layer 362 may be formed of at least one of silicon nitride, aluminum nitride, zirconium nitride, titanium nitride, hafnium nitride, tantalum nitride, silicon oxide, aluminum oxide, and titanium oxide. The first inorganic layer 362 may be deposited through a chemical vapor deposition (CVD) process or an atomic layer deposition (ALD) process, but is not limited thereto.

The organic layer 364 may be provided on the first inorganic layer 362 and may prevent particles from penetrating into the light emitting layer 320 and the top electrode 330 via the first inorganic layer 362. Also, the organic layer 364 may fill a step height between the first mode pixels RP1, GP1, and BP1 and the second mode pixels RP2, GP2, and BP2 to planarize the step height. The organic layer 364 may be formed of an organic insulating material having a refractive index (for example, a refractive index of more than 1.7) which is greater than that of the light emitting layer 320.

Although not shown, the encapsulation layer 360 may further include a second inorganic layer provided on the organic layer 364.

The second black matrix BM2 may be provided in a boundary region between the first subpixel RP, the second subpixel GP, and the third subpixel BP. The second black matrix BM2 may prevent color mixture from occurring between the first subpixel RP, the second subpixel GP, and the third subpixel BP.

Moreover, the second black matrix BM2 may be provided in a boundary region between the first mode pixels RP1, GP1, and BP1 and the second mode pixels RP2, GP2, and BP2 in each of the first subpixel RP, the second subpixel GP, and the third subpixel BP. When the security mode is driven, the second black matrix BM2 may prevent a viewing angle of the second mode pixels RP2, GP2, and BP2 from being widened.

Figure 4:
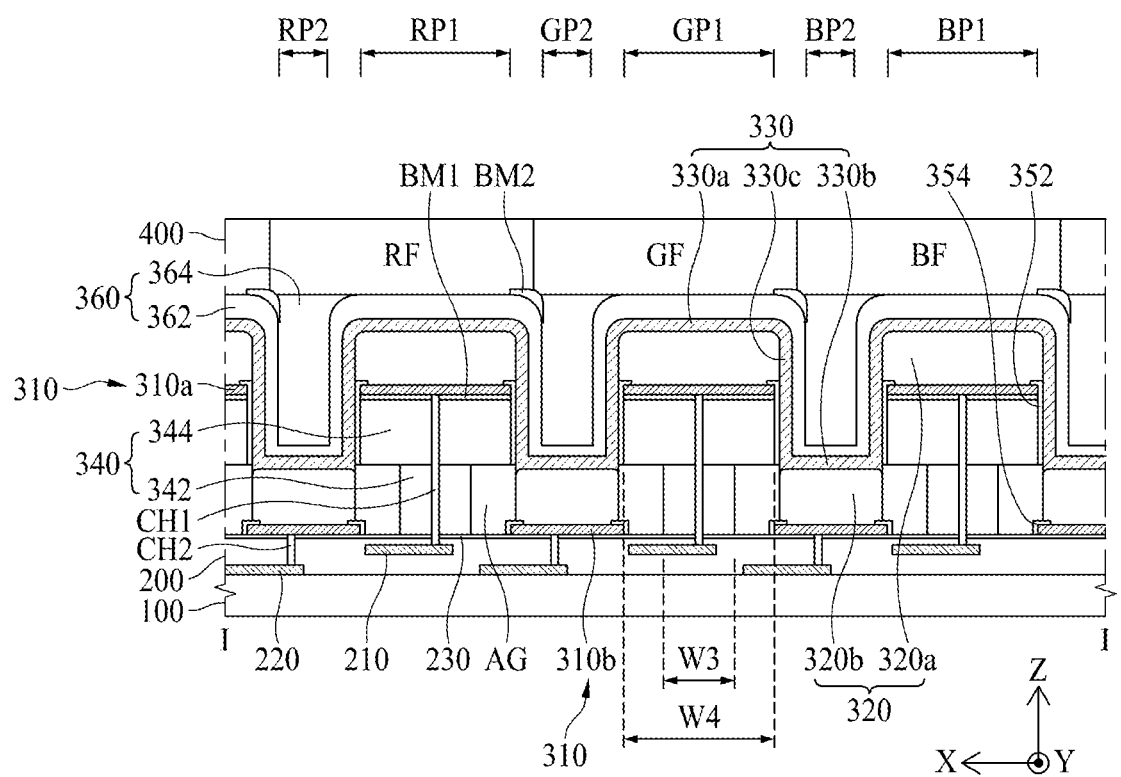
FIG. 4 is a cross-sectional view illustrating a third example taken along line I-I of FIG. 1.

FIG. 2 illustrates an example where the second black matrix BM2 is provided in a boundary region between the first mode pixels RP1, GP1, and BP1 and the second mode pixels RP2, GP2, and BP2, but embodiments are not limited thereto. In other embodiments, as illustrated in FIG. 4, the second black matrix BM2 may be provided in only a boundary region between the first subpixel RP, the second subpixel GP, and the third subpixel BP.

Moreover, FIG. 2 illustrates an example where the second black matrix BM2 is provided between the first inorganic layer 362 and the organic layer 364 which each configure the encapsulation layer 360, but embodiments are not limited thereto. In other embodiments, the second black matrix BM2 may be provided between the encapsulation layer 360 and the color filter 400.

The second black matrix BM2 may be formed of an organic layer including a black pigment, but is not limited thereto.

The color filter 400 may be provided on the encapsulation layer 360. The color filter 400 may be disposed to correspond to each of the first subpixel RP, the second subpixel GP, and the third subpixel BP. For example, a red color filter RF may be disposed to correspond to the first subpixel RP, a green color filter GF may be disposed to correspond to the second subpixel GP, and a blue color filter BF may be disposed to correspond to the third subpixel BP.

In FIG. 2, the color filter 400 is illustrated as being disposed on a surface planarized by the organic layer 364, but embodiments are not limited thereto. In a display apparatus according to another embodiment, the organic layer 364 may be omitted. In this example, the color filter 400 may be disposed on the first inorganic layer 362 and may be provided along step heights between the first mode pixels RP1, GP1, and BP1 and the second mode pixels RP2, GP2, and BP2.

Although not shown, a protection film may be further provided on the color filter 400.

The display apparatus according to an embodiment of the present disclosure may include the first mode pixels RP1, GP1, and BP1 which have a first viewing angle and are respectively provided in the subpixels RP, GP, and BP, and the second mode pixels RP2, GP2, and BP2 which have a second viewing angle and are respectively provided in the subpixels RP, GP, and BP.

Therefore, without attaching a separate security film, the display apparatus according to an embodiment of the present disclosure may display an image in the normal mode or the security mode, based on a selection by a user.

Moreover, in the display apparatus according to an embodiment of the present disclosure, because the first mode pixel and the second mode pixel are included in one subpixel, the total number of subpixels may be constant even when the display apparatus is driven in the normal mode or the security mode. Therefore, according to an embodiment of the present disclosure, even when the display apparatus is selectively driven in the normal mode or the security mode, a resolution may not be reduced and may be maintained.

Moreover, the display apparatus according to an embodiment of the present disclosure may be provided to have a step height between a first light emitting device of each of the first mode pixels RP1, GP1, and BP1 and a second light emitting device of each of the second mode pixels RP2, GP2, and BP2 by using the low refractive structure 340.

In the present disclosure, the first light emitting device may be formed by stacking the first bottom electrode 310a, the first light emitting layer 320a, and the first top electrode 330a on the low refractive structure 340. Also, the second light emitting device may be formed by stacking the second bottom electrode 310b, the second light emitting layer 320b, and the second top electrode 330b on the circuit device layer 200 where the low refractive structure 340 is not provided. The first light emitting device and the second light emitting device each formed in this manner may have a step height therebetween. Also, the first light emitting device may be disposed in an upper portion and may display an image having a wide viewing angle, and the second light emitting device may be disposed in a lower portion and may display an image having a narrow viewing angle.

Moreover, in the display apparatus according to an embodiment of the present disclosure, the first light emitting device and the second light emitting device may be respectively disposed in an upper portion and a lower portion, and thus, an interval between the first light emitting device and the second light emitting device may be reduced. Therefore, in the display apparatus according to an embodiment of the present disclosure, an aperture ratio may be enhanced.

Moreover, in the display apparatus according to an embodiment of the present disclosure, the first bottom electrode 310a of the first light emitting device and the second bottom electrode 310b of the second light emitting device may be simultaneously formed by using the low refractive structure 340 having the undercut structure, without a separate pattern process.

Moreover, in the display apparatus according to an embodiment of the present disclosure, the first light emitting layer 320a of the first light emitting device and the second light emitting layer 320b of the second light emitting device may be simultaneously formed by using the low refractive structure 340 having the undercut structure, without a separate pattern process. Therefore, in the display apparatus according to an embodiment of the present disclosure, a manufacturing process may be simplified, and the manufacturing cost may be reduced.

Moreover, in the display apparatus according to an embodiment of the present disclosure, the first light emitting layer 320a of the first light emitting device and the second light emitting layer 320b of the second light emitting device may be formed by using the low refractive structure 340 having the undercut structure. In this example, as illustrated in FIG. 2, an air gap AG may be formed next to each of both sides of the second light emitting layer 320b. The air gap AG may be lower in refractive index than the second light emitting layer 320b, and thus, in the display apparatus according to an embodiment of the present disclosure, light which is emitted from the second light emitting layer 320b and is irradiated onto both sides may be reflected by an interface between the air gap AG and the second light emitting layer 320b, and may be guided in a forward direction.

Moreover, in the display apparatus according to an embodiment of the present disclosure, the first black matrix BM1 may be disposed between the low refractive structure 340 and the first bottom electrode 310a. Accordingly, the display apparatus according to an embodiment of the present disclosure may prevent light emitted from the second light emitting layer 320b from being transferred in the first direction (the X-axis direction).

Moreover, in the display apparatus according to an embodiment of the present disclosure, the first insulation layer 352 having a refractive index less than that of the light emitting layer 320 may be provided on a sidewall of the low refractive structure 340, and thus, light emitted from the second light emitting layer 320b may be reflected by an interface between the sidewall of the low refractive structure 340 and may be guided to the forward direction.

Figure 3:
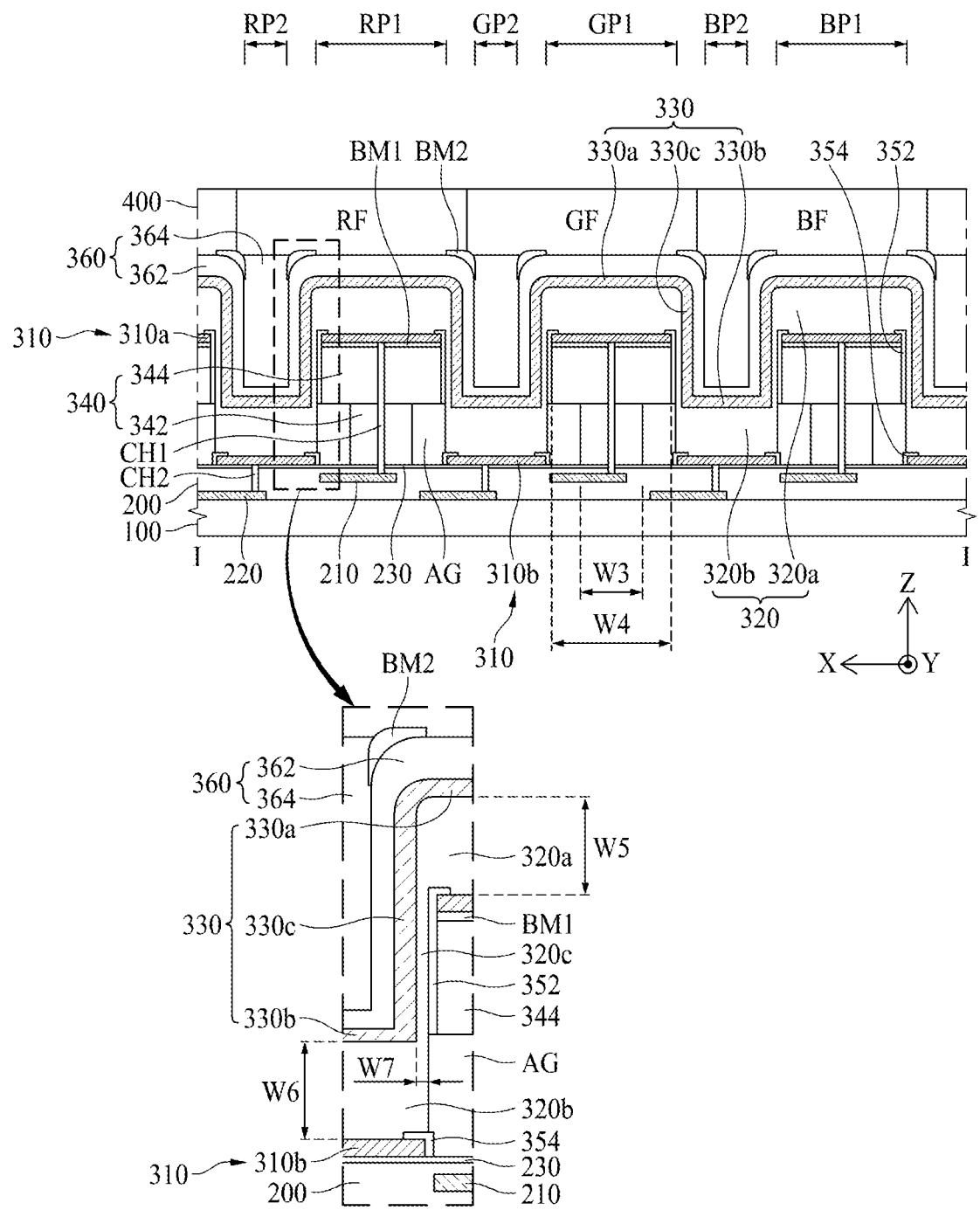
FIG. 3 is a cross-sectional view illustrating a second example taken along line I-I of FIG. 1.

FIG. 3 is a cross-sectional view illustrating a second example taken along line I-I of FIG. 1.

With reference to FIG. 3, the display apparatus according to an embodiment of the present disclosure may include a substrate 100, a circuit device layer 200, a bottom electrode 310, a light emitting layer 320, a top electrode 330, a low refractive structure 340, a first insulation layer 352, a second insulation layer 354, an encapsulation layer 360, a first black matrix BM1, a second black matrix BM2, and a color filter 400.

The substrate 100, the circuit device layer 200, the bottom electrode 310, the light emitting layer 320, the top electrode 330, the low refractive structure 340, the first insulation layer 352, the second insulation layer 354, the encapsulation layer 360, the first black matrix BM1, the second black matrix BM2, and the color filter 400 each illustrated in FIG.

3 may be substantially the same as the elements illustrated in FIG. 2. Therefore, detailed descriptions of the same elements are omitted.

The light emitting layer 320 illustrated in FIG. 3 may be provided on the bottom electrode 310. The light emitting layer 320 may be a white light emitting layer which emits white light. In this example, the light emitting layer 320 may be a common layer which is provided in a plurality of subpixels RP, GP, and BP in common.

The light emitting layer 320 may include a first light emitting layer 320a disposed in a plurality of first mode pixels RP1, GP1, and BP1, and a second light emitting layer 320b disposed in a plurality of second mode pixels RP2, GP2, and BP2.

The first light emitting layer 320a and the second light emitting layer 320b may be provided at different positions and may each emit light based on a driving mode.

In more detail, the first light emitting layer 320a may be provided on the first bottom electrode 310a provided in the first mode pixels RP1, GP1, and BP1. When the driving mode is the normal mode, the first light emitting layer 320a may emit light by applying a voltage to the first bottom electrode 310a and the first top electrode 330a.

The second light emitting layer 320b may be provided on the second bottom electrode 310b provided in the second mode pixels RP2, GP2, and BP2. When the driving mode is the security mode, the second light emitting layer 320b may emit light by applying a voltage to the second bottom electrode 310b and the second top electrode 330b.

The first light emitting layer 320a and the second light emitting layer 320b may be simultaneously formed. In the display apparatus according to an embodiment of the present disclosure, the low refractive structure 340 may be provided in the first mode pixels RP1, GP1, and BP1. In this example, in the low refractive structure 340, a first low refractive structure 342 disposed in a lower portion may be provided to have a width which is less than that of a second low refractive structure 344 disposed in an upper portion. Therefore, the low refractive structure 340 may have an undercut structure, where a portion of a lower surface of the second low refractive structure 344 overlaps the first low refractive structure 342, and the other portion of the lower surface of the second low refractive structure 344 is exposed without overlapping the first low refractive structure 342. When a material included in the light emitting layer 320 is deposited on the substrate 100 where the low refractive structure 340 is provided, the first light emitting layer 320a may be provided on the first bottom electrode 310a disposed on the low refractive structure 340, and the second light emitting layer 320b may be provided on the second bottom electrode 310b disposed on the circuit device layer 200 where the low refractive structure 340 is not provided.

In this example, a thickness of the light emitting layer 320 deposited on the substrate 100 where the low refractive structure 340 is provided may be set in order for the top electrode 330 not to be short-circuited. For example, when a thickness of the light emitting layer 320 is set thinly, the first light emitting layer 320a and the second light emitting layer 320b may be separated from each other and may be driven without interference between driving modes. However, a separation distance between the second low refractive structure 344 and the second light emitting layer 320b may increase, and thus, the top electrode 330 deposited on the first light emitting layer 320a and the second light emitting layer 320b may be short-circuited.

In order to prevent the top electrode 330 from being short-circuited, the first light emitting layer 320a and the second light emitting layer 320b may be provided to have an appropriate thickness. In the light emitting layer 320, as illustrated in FIG. 3, due to an error of a manufacturing process, in addition to the first light emitting layer 320a and the second light emitting layer 320b, a third light emitting layer 320c may be further provided next to both sides of the second low refractive structure 344.

In this example, a thickness W7 of the third light emitting layer 320c may be set to be thinner than a thickness W5 of the first light emitting layer 320a and a thickness W6 of the second light emitting layer 320b. In the display apparatus according to an embodiment of the present disclosure, because the thickness W7 of the third light emitting layer 320c is set to be thinner than the thickness W5 of the first light emitting layer 320a and the thickness W6 of the second light emitting layer 320b, a resistance of the third light emitting layer 320c may increase. Accordingly, in the present disclosure, an influence between the first light emitting layer 320a and the second light emitting layer 320b may be reduced and possibly minimized. Also, in the present disclosure, an influence of a leakage current occurring through the light emitting layer 320 may be reduced and possibly minimized between adjacent subpixels.

Figure 5:
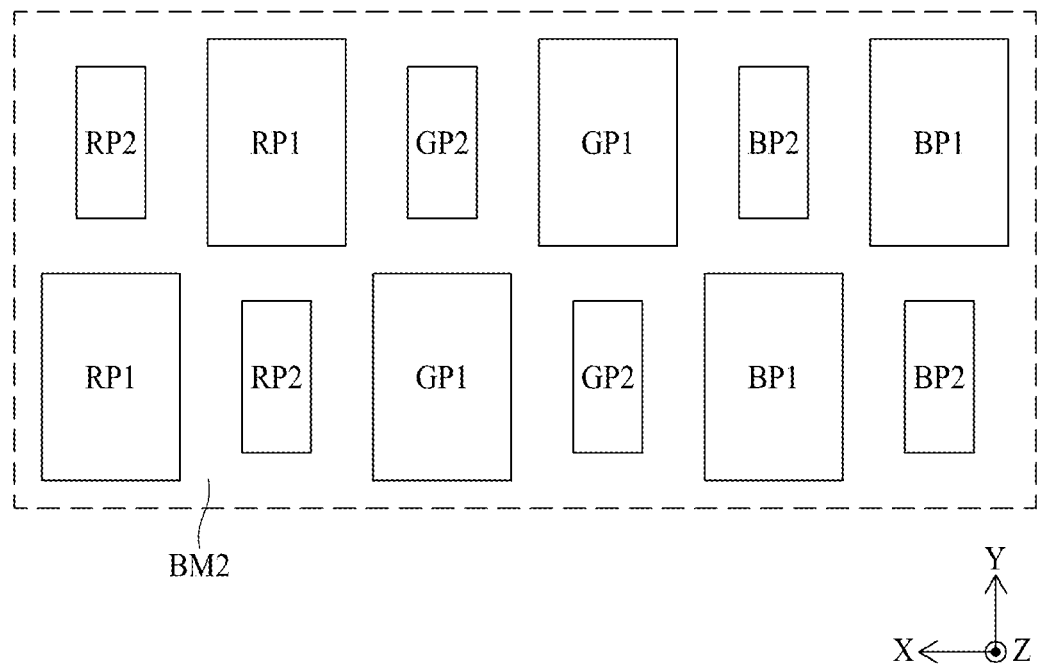
FIG. 5 is a plan view schematically illustrating an example of an arrangement structure of subpixels.
Figure 6:
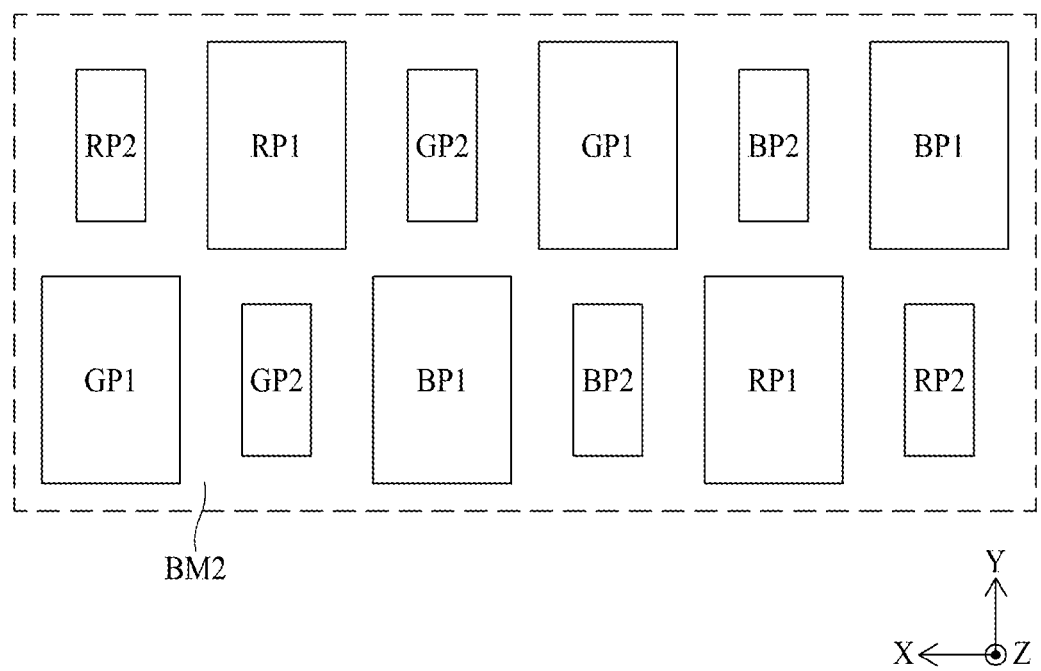
FIG. 6 is a plan view schematically illustrating another example of an arrangement structure of subpixels.

FIG. 5 is a plan view schematically illustrating an example of an arrangement structure of subpixels, and FIG. 6 is a plan view schematically illustrating another example of an arrangement structure of subpixels.

A pixel may include a first subpixel RP, a second subpixel GP, and a third subpixel BP. The first subpixel RP may emit red light, the second subpixel GP may emit green light, and the third subpixel BP may emit blue light.

To describe the first to third subpixels RP, GP, and BP, as illustrated in FIG. 5, subpixels emitting lights of different colors may be arranged in a first direction (an X-axis direction), and subpixels emitting lights of the same color may be arranged in a second direction (a Y-axis direction).

Alternatively, in the first to third subpixels RP, GP, and BP, as illustrated in FIG. 6, subpixels emitting lights of different colors may be arranged in the first direction (the X-axis direction), and subpixels emitting lights of different colors may be arranged in the second direction (the Y-axis direction).

The first to third subpixels RP, GP, and BP may respectively include a plurality of first mode pixels RP1, GP1, and BP1 having a first viewing angle, and may respectively include a plurality of second mode pixels RP2, GP2, and BP2 having a second viewing angle which is less than the first viewing angle. The first mode pixels RP1, GP1, and BP1 may be driven in a normal mode to display an image having the first viewing angle. The second mode pixels RP2, GP2, and BP2 may be driven in a security mode to display an image having the second viewing angle which is less than the first viewing angle.

With respect to the first to third subpixels RP, GP, and BP, as illustrated in FIGS. 5 and 6, second mode subpixels RP2, GP2, and BP2 may be arranged in the first direction (the X-axis direction), and second mode subpixels RP2, GP2, and BP2 may be arranged in the second direction (the Y-axis direction).

In the display apparatus according to an embodiment of the present disclosure, first mode pixels RP1, GP1, and BP1 and second mode pixels RP2, GP2, and BP2 may be alternately arranged in the first direction (the X-axis direction), and first mode pixels RP1, GP1, and BP1 and second mode pixels RP2, GP2, and BP2 may be alternately arranged in the second direction (the Y-axis direction).

Figure 7:
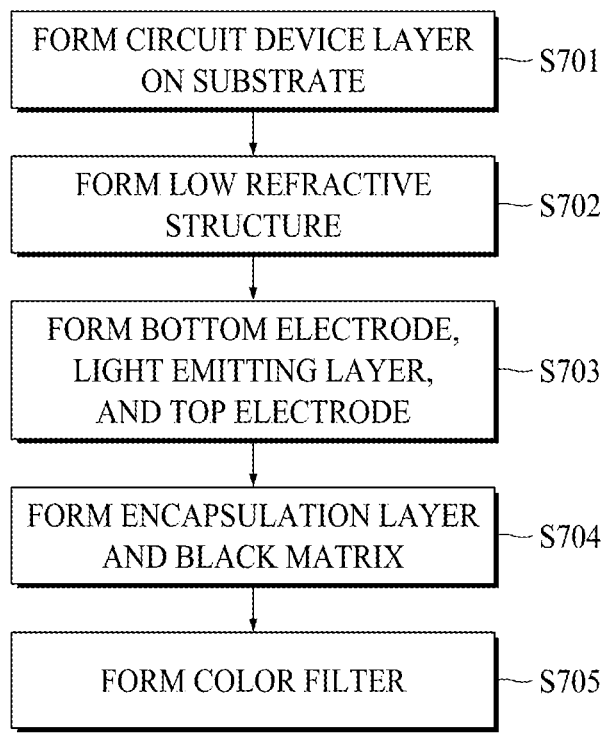
FIG. 7 is a flowchart illustrating a method of manufacturing a display apparatus according to an embodiment of the present disclosure.

FIG. 7 is a flowchart illustrating a method of manufacturing a display apparatus according to an embodiment of the present disclosure, and FIGS. 8A to 8I are cross-sectional views illustrating a method of manufacturing a display apparatus according to an embodiment of the present disclosure.

Figure 8A:
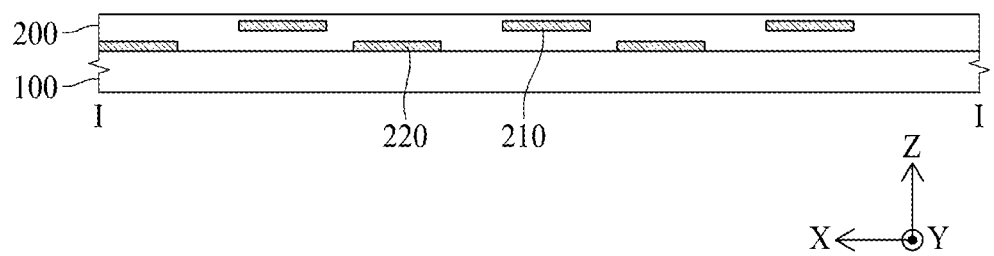
FIGS. 8A to 8L are cross-sectional views illustrating a method of manufacturing a display apparatus according to an embodiment of the present disclosure.

With reference to FIG. 7, first, a circuit device layer 200 may be formed on a substrate 100 (S701). For example, as illustrated in FIG. 8A, a second transistor 220 may be formed on the substrate 100. Subsequently, a first transistor 210 may be formed on the substrate 100 where the second transistor 220 is provided.

Figure 8B:
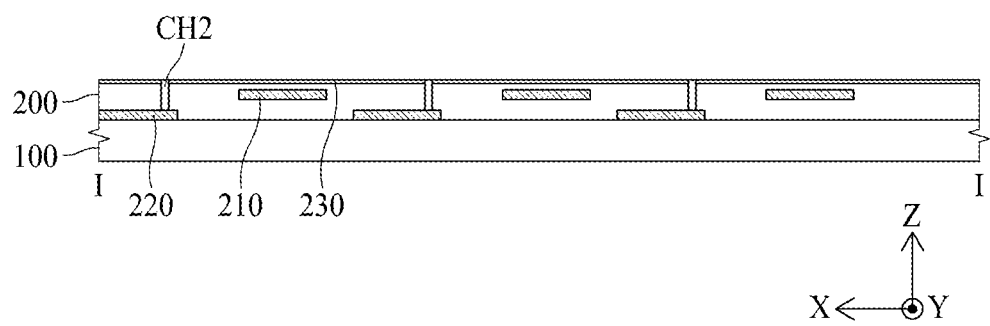

Subsequently, as illustrated in FIG. 8B, an anti-etch layer 230 may be formed on the first transistor 210 and the second transistor 220, and a second contact hole CH2 exposing a portion of the second transistor 220 may be formed.

Figure 8C:
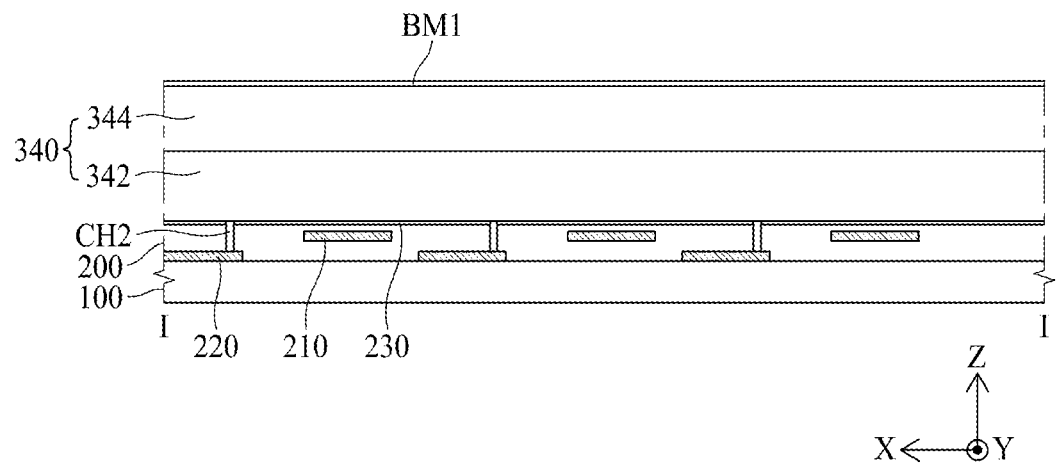

Next, a low refractive structure 340 may be formed on the circuit device layer 200 (S702). For example, as illustrated in FIG. 8C, a first low refractive material included in a first low refractive structure 342 may be formed on the circuit device layer 200, and a second low refractive material included in a second low refractive structure 344 may be formed on the first low refractive material. Also, a material included in a first black matrix BM1 may be formed on the second low refractive material.

Each of the first low refractive material and the second low refractive material may include an inorganic layer (for example, one of SiOx or SiON), but embodiments are not limited thereto.

In this example, the first low refractive material and the second low refractive material may be materials having different etch resistances. The first low refractive material may be faster in etch speed than the second low refractive material with respect to the same etchant.

Figure 8D:
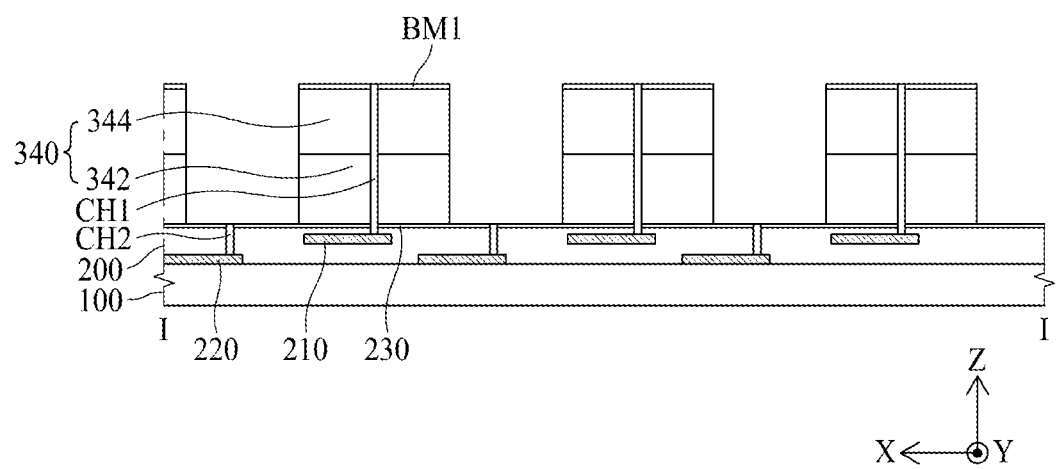

Subsequently, as illustrated in FIG. 8D, the first low refractive material and the second low refractive material may be patterned by removing the first and second low refractive materials from a plurality of second mode pixels RP2, GP2, and BP2, and a first contact hole CH1 which passes through the first and second low refractive materials and exposes a portion of the first transistor 210 may be formed.

Figure 8E:
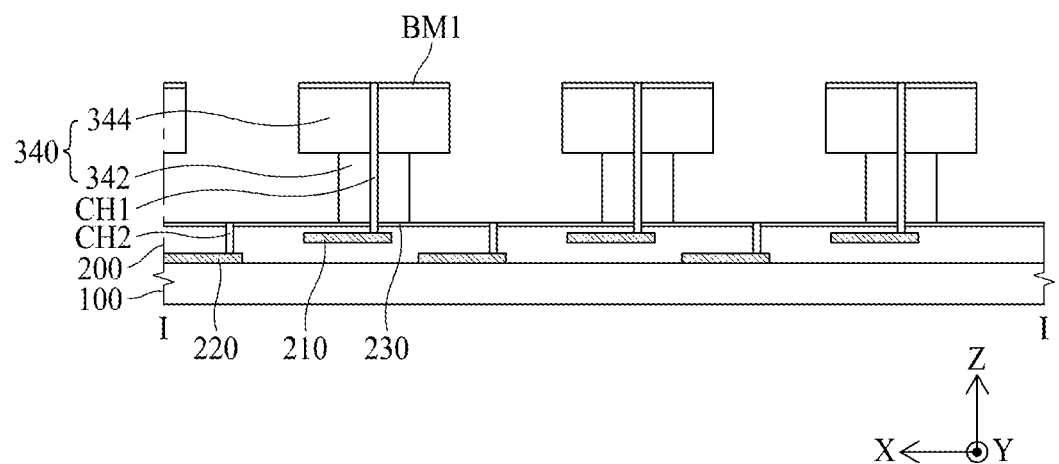

Then, as illustrated in FIG. 8E, the first low refractive structure 342 and the second low refractive structure 344 may be formed by wet-etching the patterned first and second low refractive materials. In this example, because the first low refractive material is faster in etch speed than the second low refractive material with respect to the same etchant, the first low refractive structure 342 may be formed to have a width which is less than that of the second low refractive structure 344. Accordingly, the low refractive structure 340 having the undercut structure may be formed.

Figure 8F:
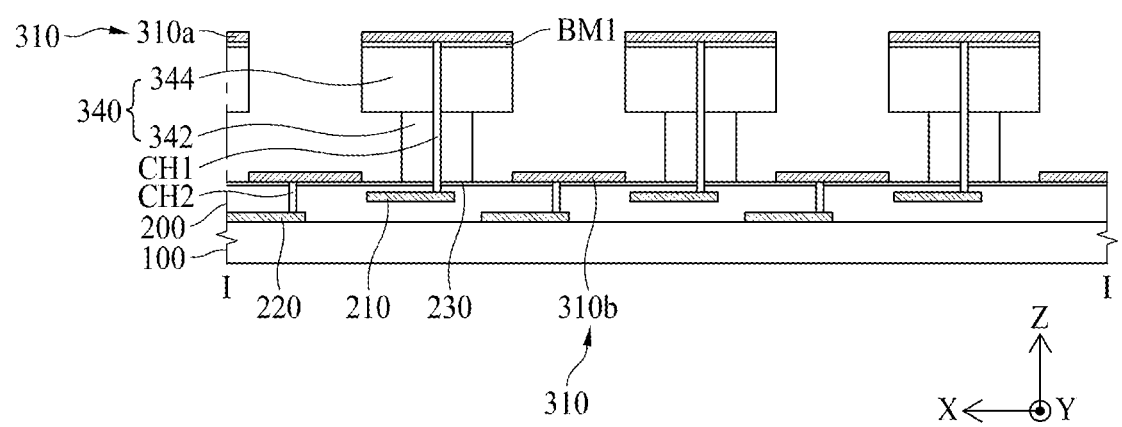

Subsequently, a bottom electrode 310, a light emitting layer 320, and a top electrode 330 may be formed on the low refractive structure 340 and the circuit device layer 200 (S703). For example, as illustrated in FIG. 8F, the bottom electrode 310 may be deposited on the substrate 100 where the low refractive structure 340 and the circuit device layer 200 are provided. The bottom electrode 310 may be formed of a metal material, which is high in reflectance, such as a stacked structure of a transparent conductive material and a reflective material (for example, a stacked structure (Ti/Al/Ti) of Al and Ti, a stacked structure (ITO/Al/ITO) of Al and ITO, an APC alloy, or a stacked structure (ITO/APC/ITO) of an APC alloy and ITO). The APC alloy may be an alloy of Ag, palladium (Pd), and Cu.

In this example, a first bottom electrode 310a may be formed on the low refractive structure 340, and a second bottom electrode 310b may be formed on the circuit device layer 200 which is exposed because the low refractive structure 340 is not formed.

In the display apparatus according to an embodiment of the present disclosure, the first bottom electrode 310a and the second bottom electrode 310b may be simultaneously formed by using the low refractive structure 340 without a separate pattern process.

Figure 8G:
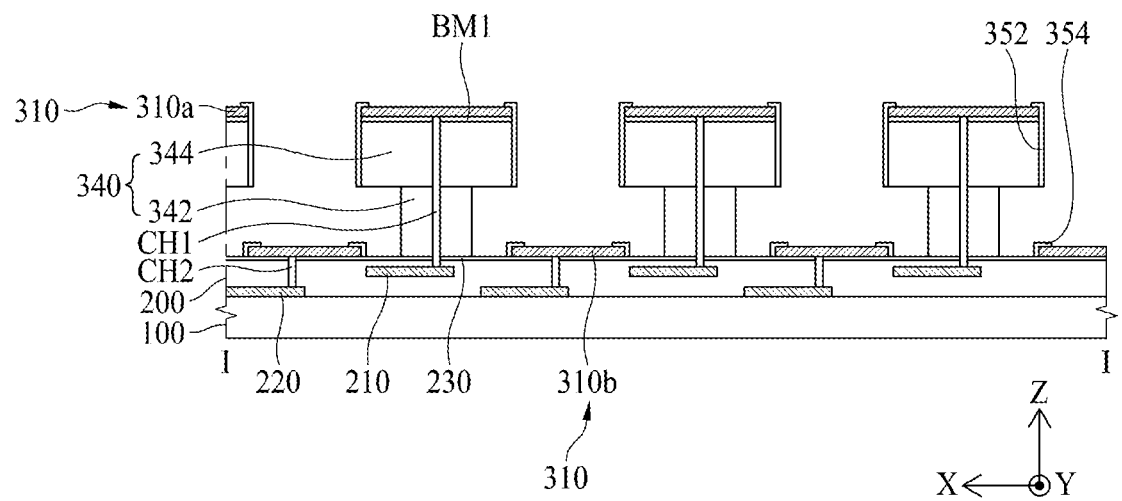

Subsequently, as in FIG. 8G, a first insulation layer 352 and a second insulation layer 354 may be formed on the bottom electrode 310. For example, an insulating material may be formed on the bottom electrode 310. The insulating material may be formed of an inorganic layer (for example, SiOx, SiON, or a multilayer thereof), but is not limited thereto. Subsequently, the first insulation layer 352 may be formed by patterning the first bottom electrode 310a to expose a portion of the first bottom electrode 310a while covering both ends of the first bottom electrode 310a and a sidewall of the second low refractive structure 344. Also, the second insulation layer 354 may be formed by patterning the second bottom electrode 310b to expose a portion of the second bottom electrode 310b while covering both ends of the second bottom electrode 310b.

Figure 8H:
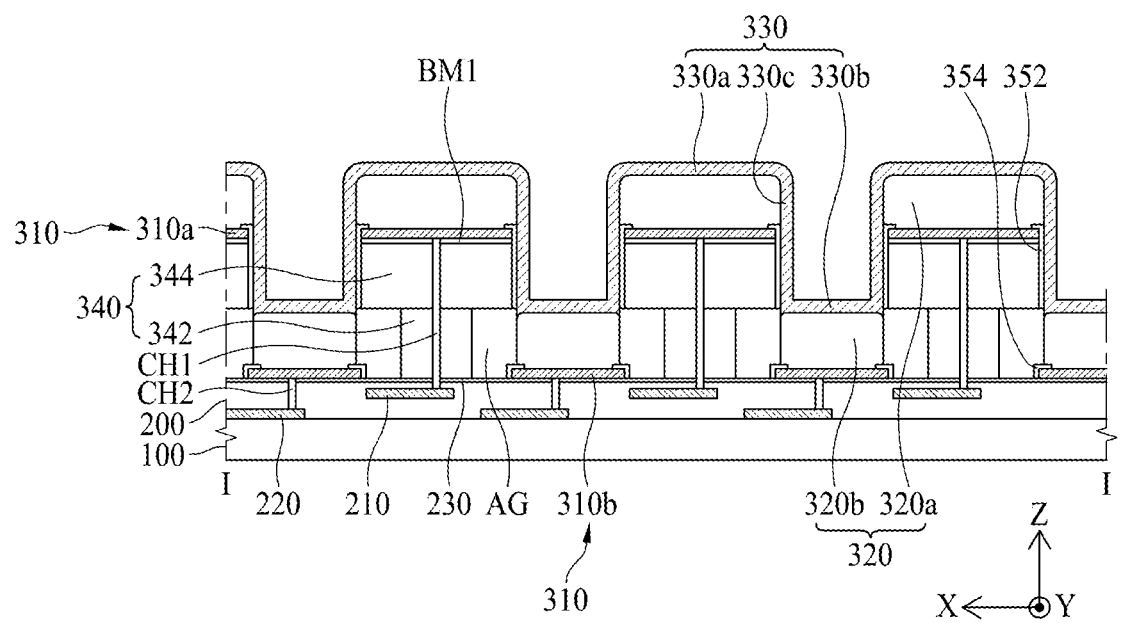

Next, as in FIG. 8H, a light emitting layer 320 may be formed on the bottom electrode 310. The light emitting layer 320 may be formed through a deposition process or a solution process. In an example where the light emitting layer 320 is formed through the deposition process, the light emitting layer 320 may be formed using an evaporation process.

The light emitting layer 320 may be a white light emitting layer that emits white light. In this example, the light emitting layer 320 may be a common layer which is provided in subpixels RP, GP, and BP in common.

When the light emitting layer 320 is a white light emitting layer, the light emitting layer 320 may be provided in a tandem structure of two or more stacks. Each of the stacks may include a hole transporting layer, at least one light emitting layer, and an electron transporting layer.

Moreover, a charge generating layer may be provided between adjacent stacks. The charge generating layer may include an n-type charge generating layer, disposed adjacent to a lower stack, and a p-type charge generating layer, which is provided on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer doped with alkali metal such as lithium (Li), sodium (Na), potassium (K), or cesium (Cs) or alkali earth metal such as magnesium (Mg), strontium (Sr), barium (Ba), or radium (Ra). The p-type charge generating layer may be formed by doping a dopant on an organic material having an ability to transport holes.

In this example, a first light emitting layer 320a may be formed on the first bottom electrode 310a, and a second light emitting layer 320b may be formed on the second bottom electrode 310b.

In the display apparatus according to an embodiment of the present disclosure, the first light emitting layer 320a and the second light emitting layer 320b may be simultaneously formed through self-alignment by using the low refractive structure 340 having the undercut structure, without a separate pattern process.

Subsequently, as illustrated in FIG. 8H, a top electrode 330 may be formed on the light emitting layer 320. The top electrode 330 may be formed of a transparent conductive material (or TCO), such as indium tin oxide (ITO) or indium zinc oxide (IZO), or a semi-transmissive conductive material such as magnesium (Mg), silver (Ag), or an alloy of Mg and Ag.

The top electrode 330 may be formed through a physical vapor deposition (PVD) process such as a sputtering process. A layer formed through the PVD process such as the sputtering process may provide a good step coverage characteristic.

The top electrode 330 may be formed on a sidewall of the second low refractive structure 344 as well as the first light emitting layer 320a and the second light emitting layer 320b. That is, a first top electrode 330a may be formed on the first light emitting layer 320a, a second top electrode 330b may be formed on the second light emitting layer 320b, and a third top electrode 330c connecting the first top electrode 330a to the second top electrode 330b may be formed.

Figure 8I:
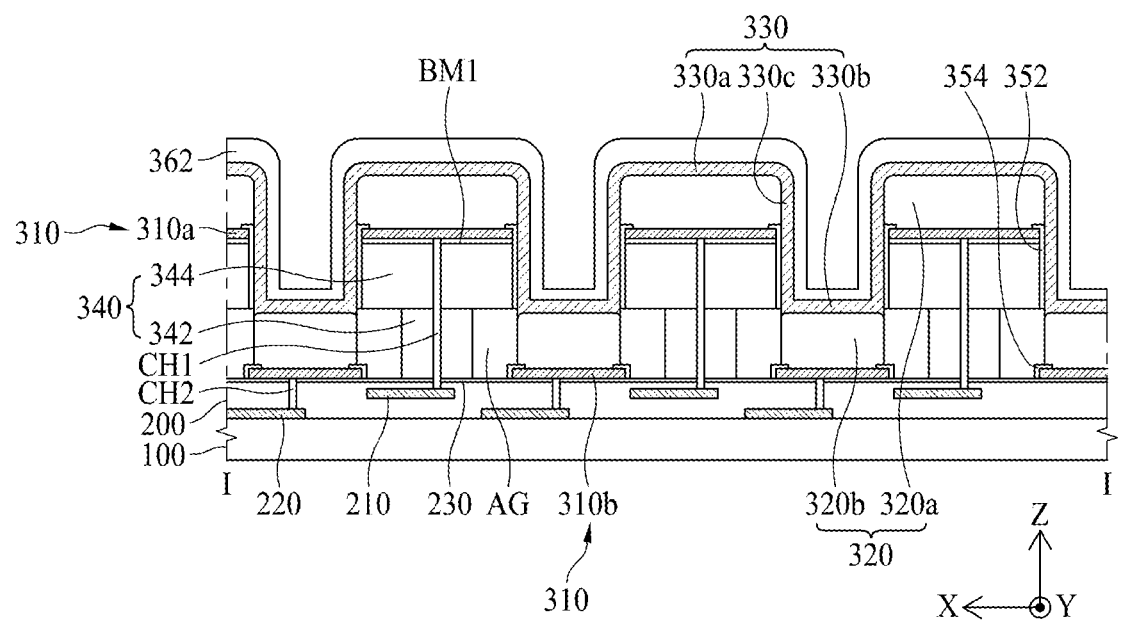

Subsequently, an encapsulation layer 360 and a second black matrix BM2 may be formed on the top electrode 330 (S704). For example, as illustrated in FIG. 8I, a first inorganic layer 362 configuring the encapsulation layer 360 may be formed on the top electrode 330. In this example, the first inorganic layer 362 may be formed to cover the first to third top electrodes 330a to 330c. The first inorganic layer 362 may be formed of silicon nitride, aluminum nitride, zirconium nitride, titanium nitride, hafnium nitride, tantalum nitride, silicon oxide, aluminum oxide, or titanium oxide. The first inorganic layer 362 may be deposited through a CVD process or an ALD process, but is not limited thereto.

Figure 8J:
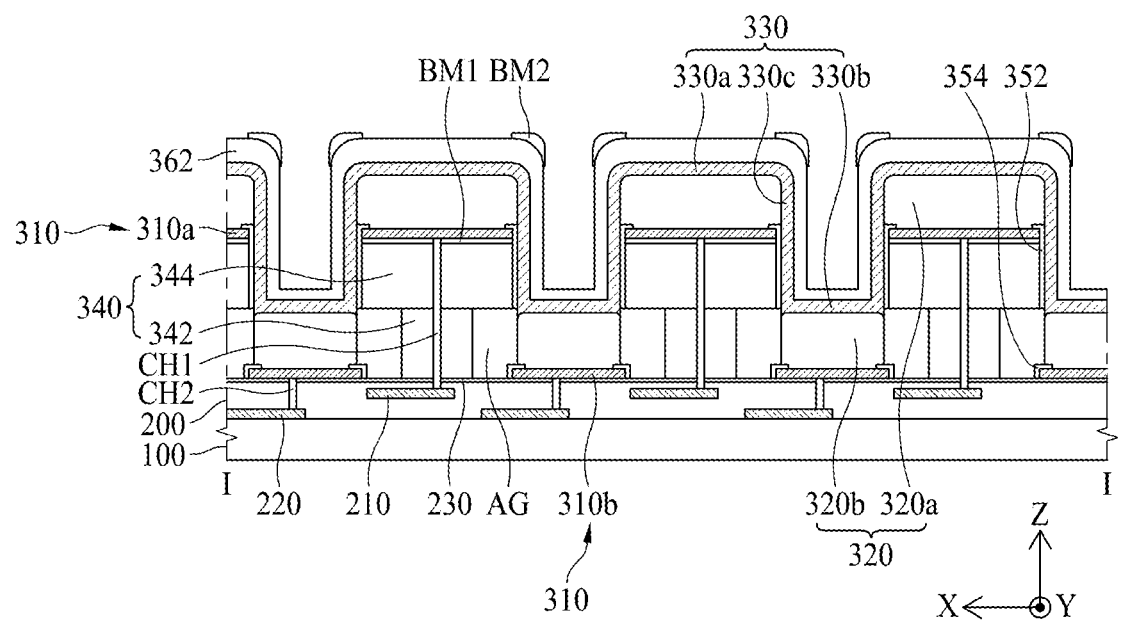

Then, as illustrated in FIG. 8J, a second black matrix BM2 may be formed on the first inorganic layer 362. The second black matrix BM2 may be formed in a boundary region between a first subpixel RP, a second subpixel GP, and a third subpixel BP. Also, the second black matrix BM2 may be provided in a boundary region between the first mode pixels RP1, GP1, and BP1 and the second mode pixels RP2, GP2, and BP2 in each of the first subpixel RP, the second subpixel GP, and the third subpixel BP. The second black matrix BM2 may be formed of an organic layer including a black pigment, but is not limited thereto.

Figure 8K:
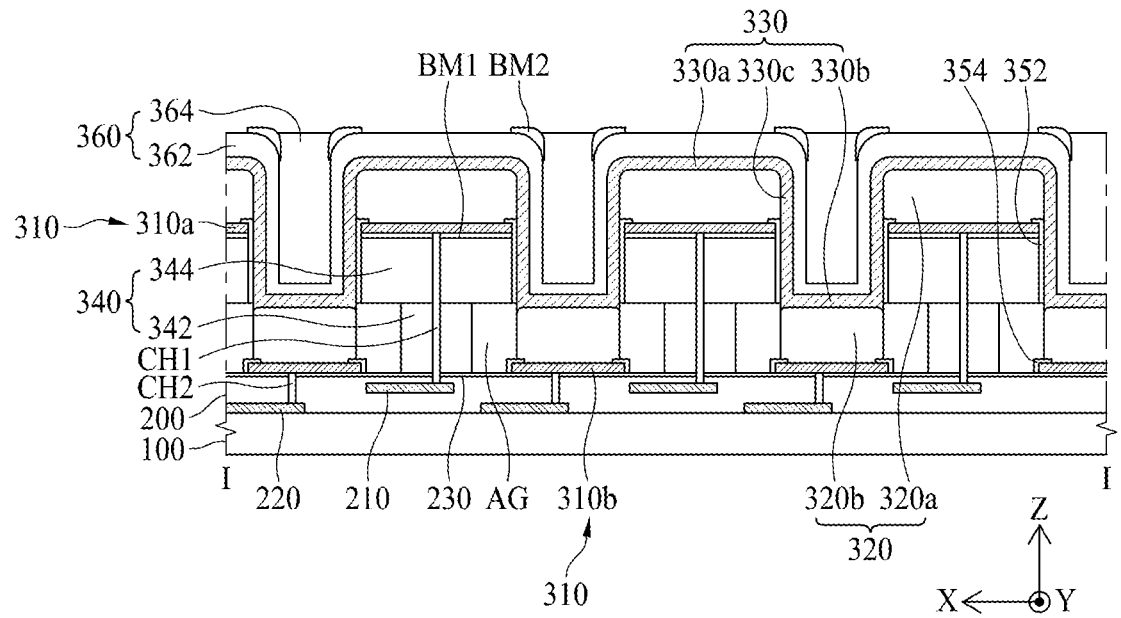

Next, as in FIG. 8K, an organic layer 364 may be formed on the first inorganic layer 362. The organic layer 364 may fill a step height between a first light emitting device of each of the first mode pixels RP1, GP1, and BP1 and a second light emitting device of each of the second mode pixels RP2, GP2, and BP2, to planarize the step height.

Figure 8L:
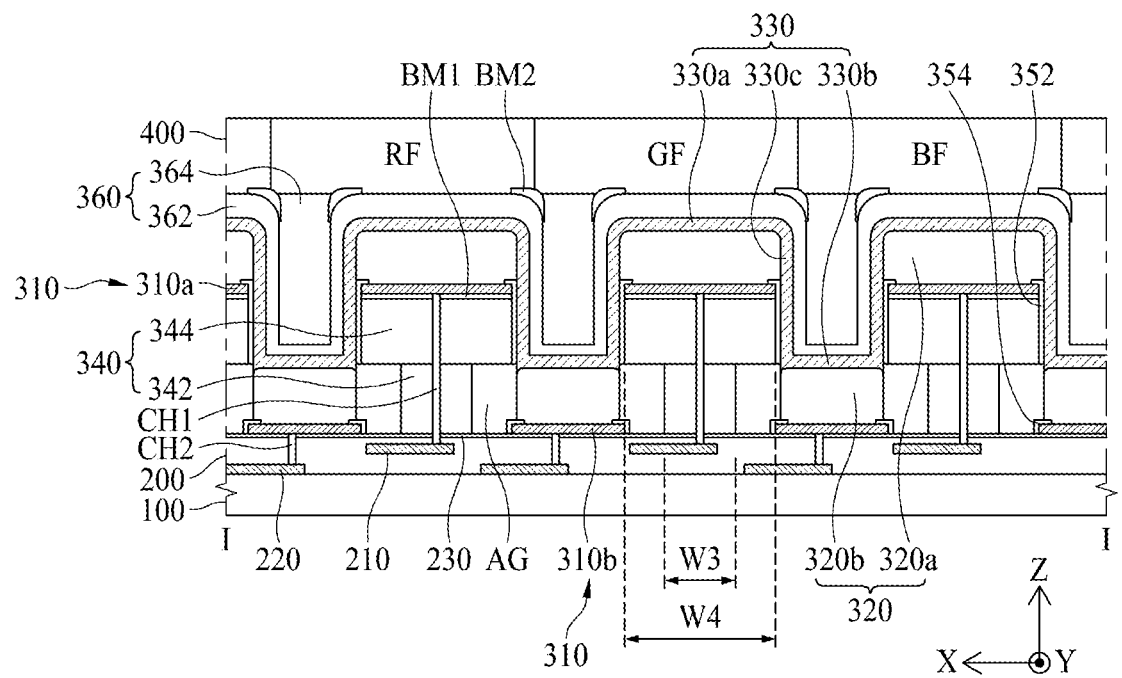

Subsequently, a color filter 400 may be formed on the encapsulation layer 360 and the second black matrix BM2 (S705). For example, as in FIG. 8L, the color filter 400 may be provided on the encapsulation layer 360 and the second black matrix BM2. The color filter 400 may be disposed to correspond to each of the first subpixel RP, the second subpixel GP, and the third subpixel BP. For example, a red color filter RF may be disposed to correspond to the first subpixel RP, a green color filter GF may be disposed to correspond to the second subpixel GP, and a blue color filter BF may be disposed to correspond to the third subpixel BP. Although not shown, an encapsulation film may be attached on the color filter 400.

According to the present disclosure, a separate security film may not be attached on the display apparatus, and in the normal mode or the security mode, an image may be displayed by a user's selection.

Moreover, in the present disclosure, the first mode pixel and the second mode pixel may be included in one subpixel, and thus, even when the normal mode or the security mode is performed, the total number of driven subpixels may be constant. Accordingly, even when the display apparatus according to an embodiment of the present disclosure is selectively driven in the normal mode or the security mode, a resolution may be maintained without being reduced.

Moreover, according to the present disclosure, the first light emitting device of the first mode pixel and the second light emitting device of the second mode pixel may have a step height therebetween by using the low refractive structure. Also, according to the present disclosure, an image having a wide viewing angle may be displayed by using the first light emitting device disposed in an upper portion, and an image having a narrow viewing angle may be displayed by using the second light emitting device disposed in a lower portion.

Moreover, according to the present disclosure, the first light emitting device and the second light emitting device may be respectively disposed in an upper portion and a lower portion, and thus, an interval between the first light emitting device and the second light emitting device may be reduced. Therefore, in the display apparatus according to an embodiment of the present disclosure, an aperture ratio may be enhanced.

Moreover, according to the present disclosure, the first bottom electrode of the first light emitting device and the second bottom electrode of the second light emitting device may be simultaneously formed by using the low refractive structure having the undercut structure, without a separate pattern process.

Moreover, according to the present disclosure, the first light emitting layer of the first light emitting device and the second light emitting layer of the second light emitting device may be simultaneously formed by using the low refractive structure having the undercut structure, without a separate pattern process. Therefore, in the display apparatus according to an embodiment of the present disclosure, a manufacturing process may be simplified, and the manufacturing cost may be reduced.

The above-described features, structures, and effects of the present disclosure are included in at least one embodiment of the present disclosure, but are not limited to only one embodiment. Furthermore, the features, structures, and effects described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the display apparatus present disclosure without departing from the spirit or scope of the disclosure. Thus, it is intended that the present disclosure covers the modifications and variations of this disclosure provided they come within the scope of the appended claims and their equivalents.

What is claimed is:

1. A display apparatus, comprising:
    a substrate including a first subpixel, a second subpixel, and a third subpixel;
    a bottom electrode on the substrate;
    a light emitting layer on the bottom electrode; and
    a top electrode on the light emitting layer,
    wherein each of the first subpixel, the second subpixel, and the third subpixel includes a first mode pixel having a first viewing angle and a second mode pixel having a second viewing angle that is less than the first viewing angle, wherein the bottom electrode comprises a first bottom electrode included in the first mode pixel and a second bottom electrode included in the second mode pixel, wherein a width of the first bottom electrode and a width of the second bottom electrode are different.

2. The display apparatus of claim 1, wherein the first bottom electrode and the second bottom electrode are on different layers.

3. The display apparatus of claim 2, further comprising:
a low refractive structure in the first mode pixel and having a refractive index that is less than a refractive index of the light emitting layer,
wherein the first bottom electrode is on the low refractive structure, and the second bottom electrode is next to each of both sides of the low refractive structure.

4. The display apparatus of claim 3, wherein:
the low refractive structure comprises a first low refractive structure having a first width, and a second low refractive structure on the first low refractive structure and having a second width that is greater than the first width, the first bottom electrode is on the second low refractive structure, and
the second bottom electrode is apart from the first low refractive structure in each of both sides of the first low refractive structure.

5. The display apparatus of claim 4, further comprising:
a first insulation layer covering an end of the first bottom electrode and a sidewall of the second low refractive structure and exposing a portion of the first bottom electrode.

6. The display apparatus of claim 3, further comprising:
a first black matrix between the first bottom electrode and the low refractive structure.

7. The display apparatus of claim 2, wherein the first bottom electrode and the second bottom electrode are simultaneously formed.

8. The display apparatus of claim 1, wherein the second bottom electrode has a width that is less than a width of the first bottom electrode.

9. The display apparatus of claim 1, further comprising:
a second insulation layer that covers an end of the second bottom electrode and exposes a portion of the second bottom electrode.

10. The display apparatus of claim 1, wherein the light emitting layer comprises a first light emitting layer on the first bottom electrode and a second light emitting layer on the second bottom electrode.

11. The display apparatus of claim 10, wherein the first light emitting layer and the second light emitting layer are on different layers.

12. The display apparatus of claim 11, further comprising:
a low refractive structure in the first mode pixel and having a refractive index that is less than a refractive index of the light emitting layer,
wherein the first light emitting layer is on the first bottom electrode that is on the low refractive structure, and the second light emitting layer is on the second bottom electrode next to each of both sides of the low refractive structure.

13. The display apparatus of claim 12, wherein:
the low refractive structure includes a first low refractive structure having a first width and a second refractive structure on the first low refractive structure and having a second width that is greater than the first width, and the first light emitting layer is on the first bottom electrode that is on the second low refractive structure, and the second light emitting layer is on the second bottom electrode that is apart from the first low refractive structure in each of both sides of the first low refractive structure.

14. The display apparatus of claim 13, further comprising an air gap between the second light emitting layer and the first low refractive structure.

15. The display apparatus of claim 13, wherein the light emitting layer further comprises a third light emitting layer on a sidewall of the second low refractive structure.

16. The display apparatus of claim 15, wherein the third light emitting layer has a thickness which is thinner than a thickness of each of the first and second light emitting layers.

17. The display apparatus of claim 10, wherein the first light emitting layer and the second light emitting layer are simultaneously formed.

18. The display apparatus of claim 10, wherein the top electrode comprises a first top electrode on the first light emitting layer and a second top electrode on the second light emitting layer.

19. The display apparatus of claim 18, wherein the first top electrode and the second top electrode are simultaneously formed.

20. The display apparatus of claim 18, wherein the top electrode further comprises a third top electrode extending from the first top electrode to the second top electrode and connecting the first top electrode to the second top electrode.

21. The display apparatus of claim 1, wherein the light emitting layer is a white light emitting layer that is provided in the first subpixel, the second subpixel, and the third subpixel in common.

22. The display apparatus of claim 21, further comprising a color filter disposed on the top electrode.

23. A display apparatus, comprising:
a substrate including a first subpixel, a second subpixel, and a third subpixel;
a bottom electrode on the substrate;
a light emitting layer on the bottom electrode;
a top electrode on the light emitting layer,
wherein each of the first subpixel, the second subpixel, and the third subpixel includes a first mode pixel having a first viewing angle and a second mode pixel having a second viewing angle that is less than the first viewing angle;
a first transistor to drive the first mode pixel; and
a second transistor to drive the second mode pixel.

24. The display apparatus of claim 23, wherein the first transistor and the second transistor are on different layers.

25. A display apparatus, comprising:
a substrate including a first subpixel, a second subpixel, and a third subpixel;
a bottom electrode on the substrate;
a light emitting layer on the bottom electrode;
a top electrode on the light emitting layer,
wherein each of the first subpixel, the second subpixel, and the third subpixel includes a first mode pixel having a first viewing angle and a second mode pixel having a second viewing angle that is less than the first viewing angle;
a first inorganic layer that covers the top electrode; and a second black matrix in a boundary region between the first subpixel, the second subpixel, and the third subpixel, and on the first inorganic layer.

26. The display apparatus of claim 25, wherein the second black matrix is further in a boundary region between the first mode pixel and the second mode pixel in each of the first subpixel, the second subpixel, and the third subpixel.

* * * * *